US007047173B1

(12) United States Patent
Larky et al.

(10) Patent No.: US 7,047,173 B1
(45) Date of Patent: May 16, 2006

(54) ANALOG SIGNAL VERIFICATION USING DIGITAL SIGNATURES

(75) Inventors: Steven P. Larky, Del Mar, CA (US); Terry D. Little, Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 882 days.

(21) Appl. No.: 09/631,427

(22) Filed: Aug. 3, 2000

(51) Int. Cl.
*G06F 17/50* (2006.01)

(52) U.S. Cl. ..................... 703/14; 703/3; 703/4; 716/1; 716/5; 716/11

(58) Field of Classification Search .................... 703/4, 703/3, 14; 716/11, 5, 1

See application file for complete search history.

(56) References Cited

OTHER PUBLICATIONS

Sassan Tabatabaei and Andre Ivanov, "A Current Integrator for BIST of Mixed-Signals IC's" dated 1999, Proc. of VLSI Test Symposium.*

Sassan Tabatabaei and Andre Ivanov, "A Built-in Current Monitor for Testing Analog Circuit Blocks",□□Apr. 1999 VLSI Test Symposium Proceedings. 17th IEEE, Apr. 25-29, 1999, pp.: 311-318□□.*

Franc Novak, Bojan Hvala, and Sandi Klavzar, "On Analog Signature Analysis", Mar. 1999, Design Automation and test in Europe Conference and Exhibition 1999 Proceedings, p. 249-253.*

Chen-Yang Pan and Kwang-Ting (Tim) Cheng, "Pseudorandom Testing for Mixed-Signal Circuits" 1997.*

Linda S. Milor, "A tutorial Introduction to Research on Analog and Mixed-Signal Circuit Testing", Oct. 1998, IEEE Transactions on Circuits and Systems—II.*

M. Renovell, F. Azais and Y. Bertrand, "On-Chip Analog Output Response Compaction", Mar. 17-20, 1997 , European Design and Test Conference, 1997. ED&TC 97. Proceedings , pp.: 568-572□□.*

* cited by examiner

*Primary Examiner*—Kamini Shah
*Assistant Examiner*—Herng-der Day
(74) *Attorney, Agent, or Firm*—Christopher P. Maiorana, PC

(57) ABSTRACT

A method for modeling analog signals that may comprise (A) detecting one or more attributed analog signals and (B) modeling the attributed analog signals by adding a signature to each of the one or more attributed analog signals.

20 Claims, 2 Drawing Sheets

ANALOG SIGNAL VERIFICATION USING DIGITAL SIGNATURES

FIELD OF THE INVENTION

The present invention relates to a method and/or architecture for analog signal verification generally and, more particularly, to a method and/or architecture for analog signal verification using digital signatures.

BACKGROUND OF THE INVENTION

Conventional approaches for verifying analog signals either (i) run a full-chip analog simulation, subsetting the analog blocks into smaller design blocks, or (ii) run layout versus schematic (LVS) simulations during final processing stages.

Such conventional approaches have several disadvantages. A full-chip analog simulation is very time consuming, difficult to setup, and may not even be possible for large designs. For large designs, when applicable, smaller subsets of the design can be created. The design subsets can be of a manageable design size. The smaller design subsets generally can be fully simulated within an analog simulator. However, the design subset approach requires extra, potentially error-inducing steps. The errors can be introduced in an effort to make a smaller design subset that includes all of the necessary functionality. Furthermore, the process of creating the smaller design subsets must be continually repeated, increasing the overall design effort.

LVS simulations can be implemented to verify analog connectivity. However, LVS simulators have severe drawbacks. Any errors found are expensive (in terms of decision schedule) to correct, since LVS simulation is implemented late in the file verification process. LVS only verifies a layout against a schematic. If the same error is introduced in both the schematic and the layout, the LVS approach will not detect the error.

SUMMARY OF THE INVENTION

The present invention concerns a method for modeling analog signals that may comprise (A) detecting one or more attributed analog signals and (B) modeling the attributed analog signals by adding a signature to each of the one or more attributed analog signals.

The objects, features and advantages of the present invention include providing a method and/or architecture for analog signal verification using digital signatures that may (i) be faster than analog simulation, (ii) be implemented without size constraints (e.g., compared to creating a subset of a design that may fit within an analog simulator), (iii) be implemented without continually rebuilding a subset, (iv) be implemented without requiring analog blocks to be completely held within an easily defined subset, (v) be compatible with a large number of analog blocks and an arbitrary mix of analog and digital blocks, (vi) locate a connection error early in the design process and/or (vii) provide verification of connections in a functional manner.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
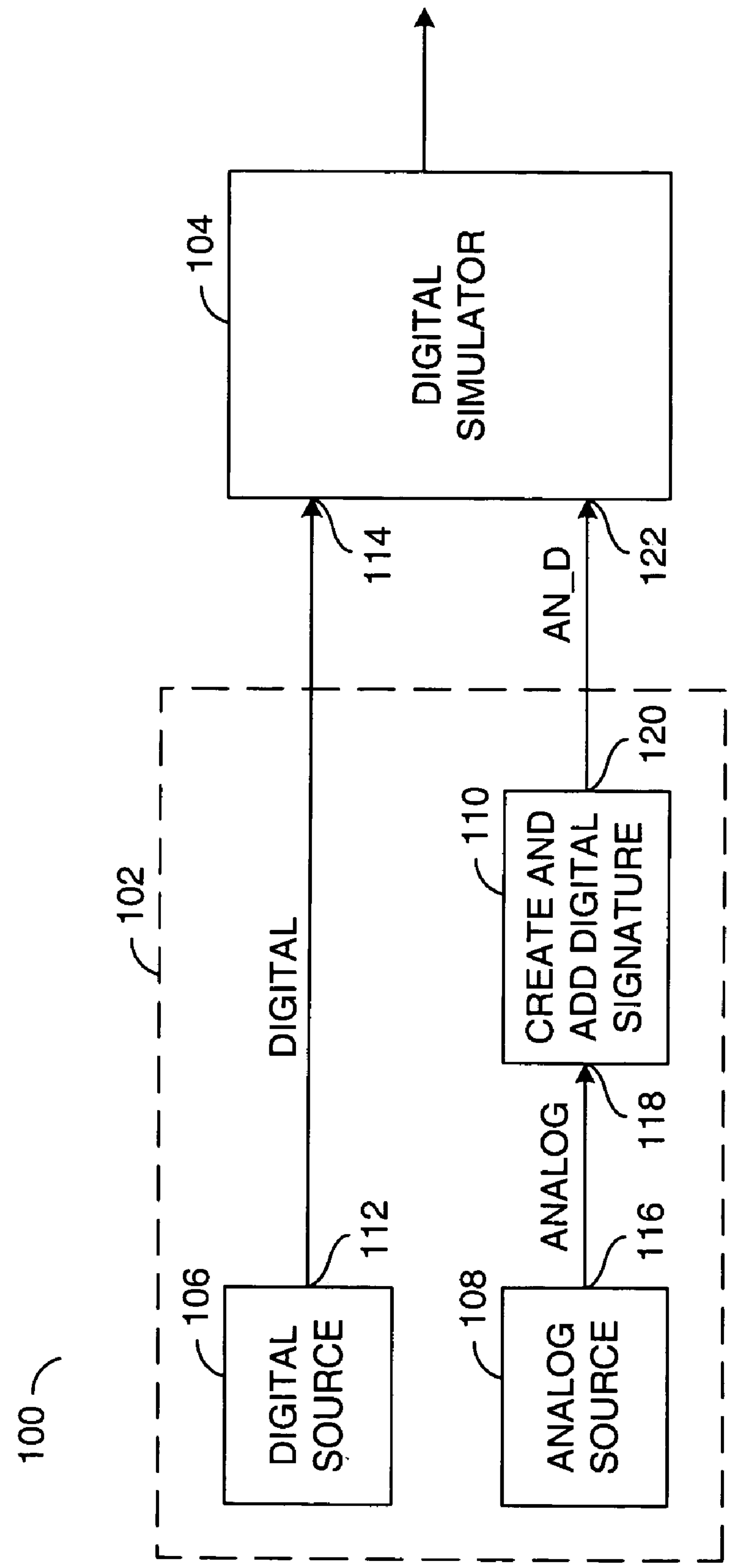
FIG. 1 is a block diagram of a preferred embodiment of the present invention.

Referring to FIG. 1, a block diagram of a circuit (or system) 100 is shown in accordance with a preferred embodiment of the present invention. The system 100 generally comprises a source block (or circuit) 102 and a digital simulator block (or circuit) 104. The source block 102 may comprise a digital source block (or circuit) 106, an analog source block (or circuit) 108 and a create and add digital signature block (or circuit) 110. The system 100 may provide analog signal verification using digital signatures. The system 100 may be implemented to provide verification of analog signals in models. The system 100 may perform multiple tests to provide verification of the models. The system 100 may provide verification of analog signals in a functional manner, decreasing chances of a same error occurring in both a schematic and a layout of a particular design.

The digital source 106 may have an output 112 that may present a signal (e.g., DIGITAL). The signal DIGITAL may be presented to an input 114 of the digital simulator 104. The analog source 108 may have an output 116 that may present a signal (e.g., ANALOG). The signal ANALOG may be presented to an input 118 of the create and add digital signature block 110. The create and add digital signature block 110 may have an output 120 that may present a signal (e.g., AN_D). The signal AN_D may be presented to an input 122 of the digital simulator 104. In one example, the signal AN_D may be implemented as an analog signal implemented with a digital signature. In another example, the signal AN_D may be implemented as an attributed analog signal. However, the signal AN_D may be implemented as another appropriate type signal in order to meet the criteria of a particular implementation. The digital simulator 104 may provide digital simulations of an analog design. The digital simulator 104 may provide digital simulations using digital signatures added to the signal ANALOG.

Figure 2:
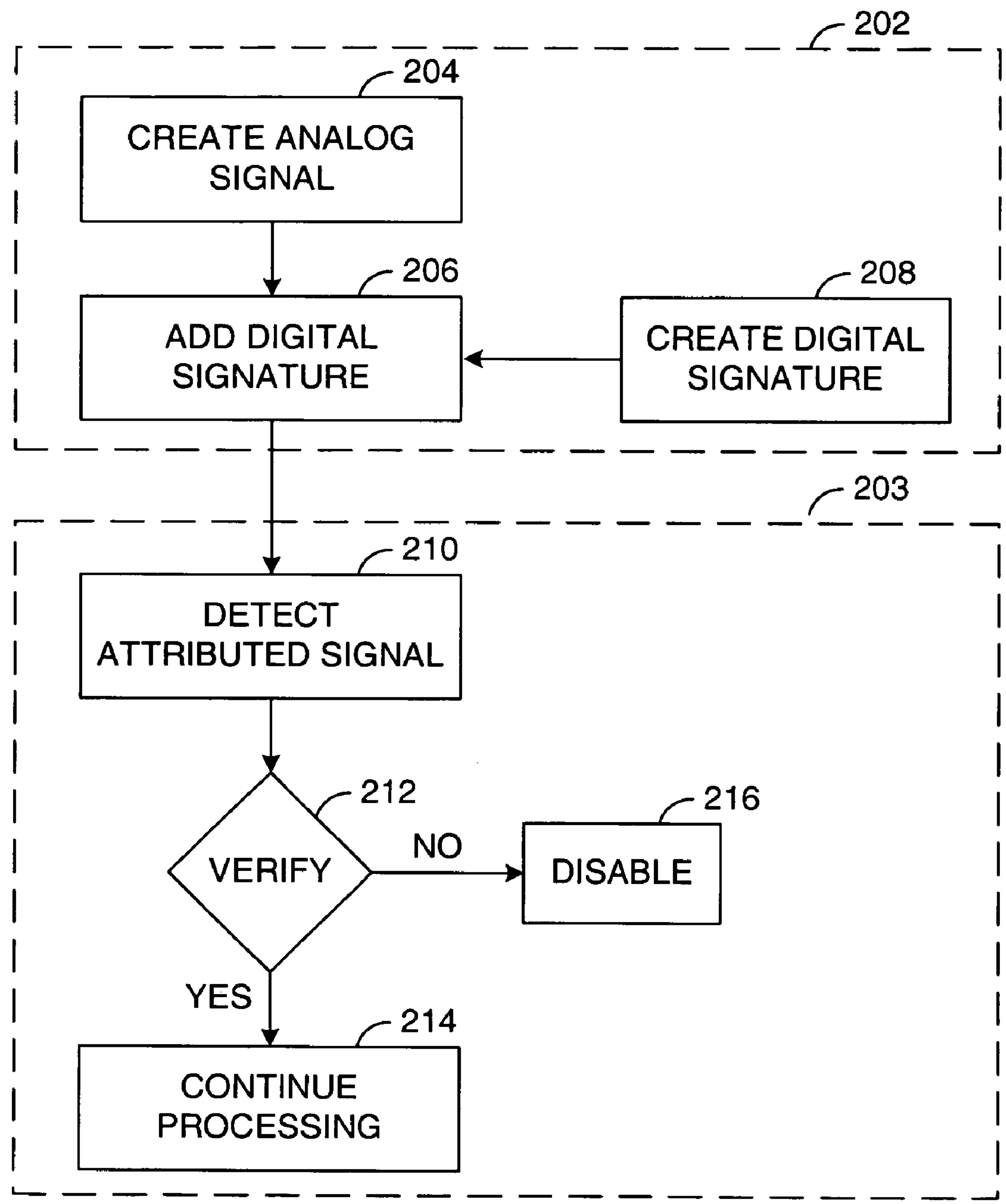
FIG. 2 is a flow diagram illustrating an exemplary operation of the present invention.

Referring to FIG. 2, a block diagram of a system (or process) 200 illustrating an operation of the present invention is shown. The system 200 may be implemented to provide verification of analog signals. The system 200 may be implemented to provide connectivity verification of the analog signals. The system 200 generally comprises a source block (or state) 202 and a destination block (or state) 203. The source block 202 may be configured to generate an analog signal attributed with a digital signature. The destination block 203 may be configured to determine a connectivity of the attributed analog signal.

The source block 202 generally comprises a receive block (or state) 204, an add block (or state) 206 and a create block (or state) 208. In one example, the receive block 204 may be implemented as a receive analog signal state, the add block 206 may be implemented as an add digital signature block and the create block 208 may be implemented as a create digital signature block. However, the receive block 204, the add block 206 and the create block 208 may each be implemented as another appropriate device or state in order to meet the criteria of a particular implementation.

The receive block 204 may present an analog signal to the add digital signature block 206. The add digital signature block 206 may add a digital signature to the analog signal. The digital signature may allow the system 200 to verify a connectivity of the analog signal. The digital signature may be generated by the create digital signature block 208. The digital signature block 208 may create an unique signature for each analog signal presented to the add digital signature block 206. The attributed analog signals (e.g., the analog signals each with an added digital signature) may be presented to the destination block 203.

The destination block 203 generally comprises a receive block (or state) 210, a verification decision block (or state) 212, a processing block (or state) 214 and a disable block (or state) 216. In one example, the receive block 210 may be implemented as a receive attributed signal block and the processing block 214 may be implemented as a continue processing block. However, the receive block 210 and the processing block 214 may each be implemented as another appropriate device or state in order to meet the criteria of a particular implementation.

The receive block 210 may receive the attributed analog signal. The receive block 210 may present the attributed analog signal to the verification block 212. The verification block 212 may attempt to verify the digital signature of the analog signal. The verification block 212 may verify the digital signature to ensure proper functionality (e.g., connectivity). If the digital signature indicates proper functionality, the system 200 may continue processing of the analog signal in the block 214. If the digital signature indicates non-proper functionality, the system 200 may disable processing of the analog signal at the disable block 216. The verification block 212 may determine connectivity of the analog signal being processed.

The system 200 may implement the digital signature to check for another appropriate attribute and/or parameter. The appropriate attributes and/or parameters may include applicable digital and/or analog parameters. The system 100 (or 200) may implement a particular number of pulses of different widths for each analog signal. Each pulse width may be applicable for a particular parameter. For example, the digital signature may be implemented as a number of multi-pulse width signals, indicating a required power supply, clock domain, etc.

The unique digital signature may be provided through a number of implementations such as (i) a varying frequency signal, (ii) a pulse of different width, (iii) a series of pulses of known width, etc. For example, a Verilog model (a Hardware Description Language (HDL) model) of an analog design (or block) may be used to allow connectivity of the analog pins to be verified in a digital simulator.

The unique signatures may allow easier implementation of analog devices. Additionally, the system 100 (or 200) may allow ease of design overhead when implementing analog devices. The system 100 (or 200) may allow multiple current sources to be implemented to provide re-assurance that each sink is connected to a source signature (e.g., the unique digital signature). The digital signatures may be automatically generated without additional user input. The digital signatures may allow a designer/user to verify connectivity of the analog signals.

The system 100 may provide an approach for verifying correct connectivity of analog signals within a digital simulation environment. The actual function of the analog signals cannot always be modeled within the digital simulator. However, it is generally desirable to verify the connectivity of the analog signals as early as possible in the design process. The system 100 may allow a user/designer to determine, early in the design process, connectivity of the analog signals. The system 100 may add digital signatures on analog ports. The system 100 generally adds a unique digital signature to each analog signal. The appropriate signature may be generated at a source and verified at a destination. The digital signature is generally output from an analog source and input to an analog destination. Such an implementation may allow the connectivity of the analog signals to be verified within a digital simulator.

The system 100 may allow Verilog models of analog blocks to be created as they normally would, modeling the function either behaviorally or functionally. The analog blocks may be inserted into a full-chip (or core) netlist as in a normal design process. For all analog signals that do not have a digital version (e.g., a current source), a unique digital signature is generally assigned. Within the Verilog model, the signature is either generated or verified, depending on whether the digital signature is a source or a sink of the analog signal. In cases where the analog signal is a sink, if the expected signature is not received, then the function of the modeled analog block is disabled.

Where the analog signal is an output, the digital signature may be created within an analog model for a particular block. Where the analog signal is an input, the digital signature may be verified to ensure the connectivity is as expected. If the signal is not as expected, the function of the analog modeled block is generally disabled. The disabled analog modeled block may be easily detected in the digital simulator.

The system 100 may add an unique digital signature to an analog pin within a Verilog model of an analog block. The digital signature may allow a connectivity of the analog pin to be verified in a digital simulator. The system 100 may allow a non-analog savvy engineer to easily implement analog blocks.

The system 100 may be implemented to verify the connectivity and correctness of analog circuitry within a complex logic design. The system 100 may create a unique digital signature for each unique analog source and add code to a model of an analog block to cause the unique signature to be generated within a digital simulator. The added code may be implemented to allow the digital simulator to detect and verify the unique digital signature. The system 100 may allow a digital simulator to verify a correct connectivity of an analog signal within a digital simulator. The system 100 may allow a digital simulator to verify that a number of analog signals have been correctly connected.

The system 100 may reduce errors related to integration of analog intellectual property (IP). The system 100 may allow ease of analog IP implementation. The value of the system 100 may grow as more analog IP is reused and the original designers are not as involved. Furthermore, the system 100 may be implemented for electronic design automation (EDA) tool companies.

The system 100 (or 200) may be faster than analog simulation. The system 100 may have no size constraints (e.g., compared to creating a subset of the design that may be required to fit within an analog simulator). The system 100 may not be required to continually rebuild an analog subset. The system 100 may not require the analog blocks (e.g., devices) to be completely held within an easily defined subset. The system 100 may be compatible with a large number of analog blocks and an arbitrary mix of analog and digital blocks.

Additionally, the system 100 may determine connection errors at an earlier processing time saving valuable resources. The system 100 may verify the analog connections in a functional manner, decreasing the chances of a same error occurring in both the schematic and the layout of the device.

The following is an example of Verilog source files that may be used to implement the present invention:

```
// Analog signature pulse generator for use with test_sig.v
module gen_sig (signature);
output signature;
reg signature;
parameter ref_num = 0;
initial begin
    signature = 0;
    #(ref_num + 100) signature = !signature;
    $display("signature %0d high, %t", ref_num, $time);
    #(ref_num * 2 + 200) signature = !signature;
    $display("signature %0d low, %t", ref_num, $time);
end
endmodule
// Analog signature pulse checker for use with gen_sig.v
module test_sig (signature, error);
input     signature;
output    error;
reg       error;
parameter ref_num = 0;
integer   edge_det;
initial begin
    error = 0;
    edge_det = 0;
    $display("Initialize current source checker %0d", ref_num);
end
always @(signature) begin
    $display("Test Signature %0d, = %b", ref_num, signature);
end
initial begin : CHECK
    #50;
    @(posedge signature) begin
        edge_det = 1;
        #(ref_num * 2 + 200) if ( !signature ) begin
            $display("ERROR: on current source %0d signature low,
expected high :ERROR", ref_num);
            error = 1;
        end
        #1 if ( signature ) begin
            $display("ERROR: on current source %0d signature high
expected low :ERROR", ref_num);
            error = 1;
        end
        if (!error)
            $display("VERIFIED: Current source %0d signature
:VERIFIED, %t", ref_num, $time);
        disable EDGE_DET;
    end
end
initial begin : EDGE_DET
    #(ref_num + 150) if (!edge_det) begin
        $display("ERROR: Signature check END on %0d, NO
SIGNATURE DETECTED :ERROR", ref_num);
        disable CHECK;
    end
end
endmodule
```

The function performed by the flow diagram of FIG. 2 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMs, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

What is claimed is:

1. A method for verifying connectivity of one or more analog signals through an analog design, comprising the steps of:

(A) creating a Hardware Description Language model of said analog design;

(B) generating said one or more analog signals utilized by said analog design;

(C) creating a unique digital signature for each of said one or more analog signals and adding code to cause each of said unique digital signatures to be generated within a digital simulator;

(D) generating one or more source signals by adding each of said unique digital signatures to each of said analog signals;

(E) modeling said analog design using said source signals in place of said analog signals in said model; and (F) verifying said connectivity using said digital simulator to perform one or more simulations of said analog design with said source signals propagating through said analog design.

2. The method according to claim 1, wherein each of said digital signatures corresponds to a type of said analog signals having a predetermined parameter.

3. The method according to claim 1, wherein each of said digital signatures comprises a unique pulse width.

4. The method according to claim 1, wherein verifying said connectivity comprises the sub-step of:

verifying said model of said analog design for an analog block within said analog design configured to receive at least a particular one of said analog signals.

5. The method according to claim 4, wherein verifying said model comprises the sub-step of:

verifying an output signal of said analog block for said unique digital signature associated with said particular one of said analog signals.

6. The method according to claim 1, wherein each of said digital signatures comprises a plurality of pulses.

7. The method according to claim 1, wherein each of said digital signatures comprises a varying frequency signal.

8. The method according to claim 1, wherein said Hardware Description Language model comprises a Verilog model.

9. A method for testing a Hardware Description Language model of an analog design, comprising the steps of:

(A) generating one or more attributed signals each (i) having a unique digital signature to be generated within a digital simulator by adding code to a source block within said model of said analog design and (ii) presented by said source block;

(B) using said digital simulator to perform one or more simulations of said model of said analog design; and (C) verifying connectivity of said attributed signals to a destination block within said model of said analog design by verifying reception of said unique digital signatures associated with each of said attributed signals at said destination block.

10. The method according to claim 9, further comprising the step of:

disabling processing of a particular one of said attributed signals if said particular attributed signal is not verified at said destination block.

11. The method according to claim 9, further comprising the step of:

verifying said model of said analog design for said destination block configured to receive at least one of said attributed signals.

12. The method according to claim 9, wherein said Hardware Description Language model comprises a Verilog model.

13. A system comprising:

a model of an analog design including a Hardware Description Language modeled source for creating (i) a plurality of analog signals utilized by said analog design, (ii) a plurality of unique digital signatures and (iii) one or more source signals by adding each of said unique digital signatures to each of said analog signals; and a digital simulator configured to (i) simulate a Hardware Description Language model created for said analog design, (ii) receive said source signals, (iii) incorporate code to generate said unique digital signatures within said digital simulator and (iv) verify a connectivity of said analog signals through said analog design by performing one or more simulations of said analog design with said source signals propagating through said analog design.

14. The system according to claim 13, wherein said source comprises an analog source block configured to generate said analog signals.

15. The system according to claim 14, wherein said source further comprises an adder block configured to (i) generate said unique digital signatures and (ii) add said unique digital signatures to said analog signals.

16. The system according to claim 15, wherein said source further comprises a digital source block configured to generate at least one digital signal used by said digital simulator.

17. The system according to claim 13, wherein each of said digital signatures comprise a plurality of pulses.

18. The system according to claim 17, wherein each of said pulses have a unique width to identify said analog signals.

19. The system according to claim 17, wherein each of said digital signatures has a varying frequency.

20. The system according to claim 13, wherein said Hardware Description Language model comprises a Verilog model.

* * * * *